(12) United States Patent
Murai et al.

(10) Patent No.: US 7,796,845 B2
(45) Date of Patent: Sep. 14, 2010

(54) CIRCUIT BOARD AND METHOD FOR MANUFACTURING THE SAME

(75) Inventors: Makoto Murai, Gifu (JP); Ryosuke Usui, Ichinomiya (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 11/678,321

(22) Filed: Feb. 23, 2007

(65) Prior Publication Data
US 2007/0199733 A1     Aug. 30, 2007

(30) Foreign Application Priority Data
Feb. 24, 2006 (JP) .............................. 2006-049345

(51) Int. Cl.
| | |
|---|---|
| G02B 6/12 | (2006.01) |
| H01L 23/52 | (2006.01) |
| H01L 23/40 | (2006.01) |
| H01L 23/48 | (2006.01) |
| H05K 1/18 | (2006.01) |
| H05K 1/00 | (2006.01) |
| H01R 12/04 | (2006.01) |
| H01L 21/4763 | (2006.01) |

(52) U.S. Cl. .................. 385/14; 257/758; 257/774; 361/762; 174/250; 174/262; 438/662; 438/637; 438/639

(58) Field of Classification Search ................ 385/14
See application file for complete search history.

(56) References Cited

U.S. PATENT DOCUMENTS

| | | | |
|---|---|---|---|
| 5,346,750 A | 9/1994 | Hatakeyama et al. | |
| 5,972,482 A | * | 10/1999 | Hatakeyama et al. ....... 428/209 |
| 6,518,515 B2 | 2/2003 | Nishii et al. | |
| 2006/0223307 A1 | * | 10/2006 | Gotoh et al. ................. 438/640 |
| 2007/0074904 A1 | * | 4/2007 | Kohara et al. ............... 174/262 |
| 2007/0164349 A1 | 7/2007 | Nakasato et al. | |
| 2007/0200220 A1 | 8/2007 | Murai et al. | |

FOREIGN PATENT DOCUMENTS

| | | |
|---|---|---|
| JP | 2005/055401 | 3/1993 |
| JP | 08-288605 | 11/1996 |
| JP | 09/003195 | 1/1997 |
| JP | 2001-68818 | 3/2001 |
| JP | 2001-068818 * | 3/2001 |

(Continued)

OTHER PUBLICATIONS

Japanese Office action issued in Japanese Patent Application No. 2006-049345 on Oct. 27, 2009.

*Primary Examiner*—Uyen-Chau N Le
*Assistant Examiner*—Kajli Prince
(74) *Attorney, Agent, or Firm*—Fish & Richardson P.C.

(57) ABSTRACT

Provided is a circuit board which suppresses abnormal formation of plated layer inside a via, caused by core materials of glass fibers or the like projected from a side wall of the via and which helps to improve the connection reliability of the via. An insulating layer, which is formed of thermoset resin and embedded with glass fibers, is provided between a first wiring layer and a second wiring layer. The glass fibers projected into a via hole side from a side wall of the via hole in different positions are embedded into a via conductor in such a state that the glass fibers are jointed with each other.

2 Claims, 5 Drawing Sheets

| | FOREIGN PATENT DOCUMENTS | | JP | 2004-288795 | 10/2004 |
|---|---|---|---|---|---|
| JP | 2002-232102 | 8/2002 | WO | WO 2004/084594 A1 * | 9/2004 |
| JP | 2002/237681 | 8/2002 | | | |
| JP | 2002-314254 * | 10/2002 | * cited by examiner | | |

CIRCUIT BOARD AND METHOD FOR MANUFACTURING THE SAME

BACKGROUND OF THE INVENTION

1. Field of the Invention

The present invention relates to a circuit board on which electronic parts can be mounted. More particularly, the present invention relates to a circuit board in which wiring layers are electronically connected with each other by a via conductor.

2. Description of the Related Art

The circuit boards on which electronic parts, such as semiconductor devices, are mounted are recently increasingly multilayered in response to the increase in density of circuit arrangement. Generally, wiring layers in a circuit board are electrically insulated from each other by an intervening insulating layer and electrically connected with each other by a via conductor that penetrates the insulating layer at a predetermined position.

More specifically, when a high-density multilayer printed circuit board is manufactured using a glass epoxy substrate made of glass fiber impregnated with epoxy resin, blind via holes are formed by a $CO_2$ laser processing. Reference (1) listed in the following Related Art List discloses a typical example of a circuit board with such via holes formed therein. With a circuit board as described in Reference (1), the resin layer therein contains glass fibers to give strength thereto, and parts of the glass fibers projecting from the side wall of the via hole form an anchor structure with a plated layer formed in the via hole.

Related Art List (1) Japanese Patent Application Laid-Open No. 2004-288795.

With such a conventional circuit board, laser processing leaves the sections or end faces of glass fiber exposed at the side wall surface of the via hole. When these glass fibers are projecting toward the center of the via hole from the side walls thereof, formation of a plated layer on the side wall of the via hole creates abnormal growths of plating at the section or end face of glass fiber, with the result that the portions of the sections or end faces of glass fiber project into the via hole. These abnormal growths of plating will make it difficult to embed photo solder resist (PSR) fully in the via hole, thus reducing the connection reliability of the via.

SUMMARY OF THE INVENTION

The present invention has been made to resolve problems as described above, and a general purpose thereof is to provide a technology for improving the connection reliability of a via by eliminating the abnormal formation, of plated layer inside the via, caused or influenced by core materials of glass fiber or the like projecting from a side wall of the via.

One embodiment of the present invention relates to a circuit board (circuit substrate). The circuit board comprises: a plurality of wiring layers; an insulating layer, including core materials therein, which is formed of resin that electrically insulates each of the plurality of wiring layers from another; and a via conductor, provided in a via hole penetrating the insulating layer at a predetermined position, which electrically interconnects the plurality of wiring layers, wherein at different positions of a side wall of the via hole, some core materials projected from a side of the via hole are joined together in the via conductor. The via conductor is a copper plated layer, for instance. Glass fibers are suitably used as the core materials. The glass fibers are arranged and oriented in a manner that each of them extends in a constant direction. Thus, when the glass fibers are joined with each other, their joint becomes U-shaped. In such a case, if a plated layer is covered by a side wall of the via hole, the U-shaped joint will bite into the plating. As a result, even if there occurs some force to rip a copper plating up, the anchor effect produced by the joints of glass fibers will suppress such a force. Also, the resin is preferably selected from a group consisting of BT resin-type epoxy resin and polyimide.

According to this structure described as above, a plurality of glass fibers projecting from the side wall of the via hole are joined together. Thereby, the glass fibers are prevented from protruding inside the via, and any failures or defects in the formation of a via conductor is prevented. Since the surface area of the glass fibers, in contact with the via conductor, in the via conductor increases, the heat radiation of the via is improved. Also, the joints connecting the glass fibers with each other are embedded completely within the via conductor. As a result, even if there occurs some force to rip the via conductor up, the anchor effect produced by the joints of glass fibers will suppress such a force.

Another embodiment of the present invention relates to a method for manufacturing a circuit board having a via that interconnects wiring layers, and the method comprises: forming an insulating layer, made of resin, which is embedded with core materials; forming a via hole by irradiating the insulating layer with laser whose wavelength range allows for absorbing of the core materials, and joining together at least some core materials projected from different positions on a side wall of the via hole; and covering the mutually jointed core materials with a plated layer by forming the plated layer in the side wall of the via hole, and electrically interconnecting the wiring layers arranged by way of the insulating layer. Here, "laser whose wavelength range allows for absorbing of the core materials" depends on what the core is made of but it is preferably an infrared wavelength range which is a wavelength range where the energy of light absorbed into a matter is easily transformable to the heat. Glass fibers are suitably used as the core materials. The glass fibers are arranged in a manner that each of them extends in a constant direction. Thus, when the glass fibers are joined with each other, their joint becomes U-shaped. In such a case, if a plated layer is covered by a side wall of the via hole, the U-shaped joint will bite into the plating. As a result, even if there occurs some force to rip a copper plating up, the anchor effect produced by the joints of glass fibers will suppress such a force. $CO_2$ laser is preferably used as the laser.

According to this method, a circuit board can be manufactured in which a plurality of glass fibers projecting from the side wall of the via hole are joined together, the glass fibers are prevented from protruding inside the via and any failures or defects in the formation of a via conductor is prevented. Since the surface area of the glass fibers, in contact with the via conductor, in the via conductor increases, a circuit board can be manufactured whereby the heat radiation of the via is improved. Also, the joints connecting the glass fibers with each other are embedded completely within the via conductor. Hence, a circuit board can be manufacture wherein if there occurs some force to rip the via conductor up, the anchor effect produced by the joints of glass fibers will suppress such a force.

It is to be noted that any arbitrary combinations or rearrangement, as appropriate, of the aforementioned constituting elements and so forth are all effective as and encompassed by the embodiments of the present invention.

Moreover, this summary of the invention does not necessarily describe all necessary features so that the invention may also be sub-combination of these described features.

BRIEF DESCRIPTION OF THE DRAWINGS

Embodiments will now be described by way of examples only, with reference to the accompanying drawings which are meant to be exemplary, not limiting and wherein like elements are numbered alike in several Figures in which.

DETAILED DESCRIPTION OF THE INVENTION

The invention will now be described by reference to the preferred embodiments. This does not intend to limit the scope of the present invention, but to exemplify the invention.

Hereinbelow, the embodiments will be described with reference to the accompanying drawings.

Basic Structure of Circuit Board

Figure 1:
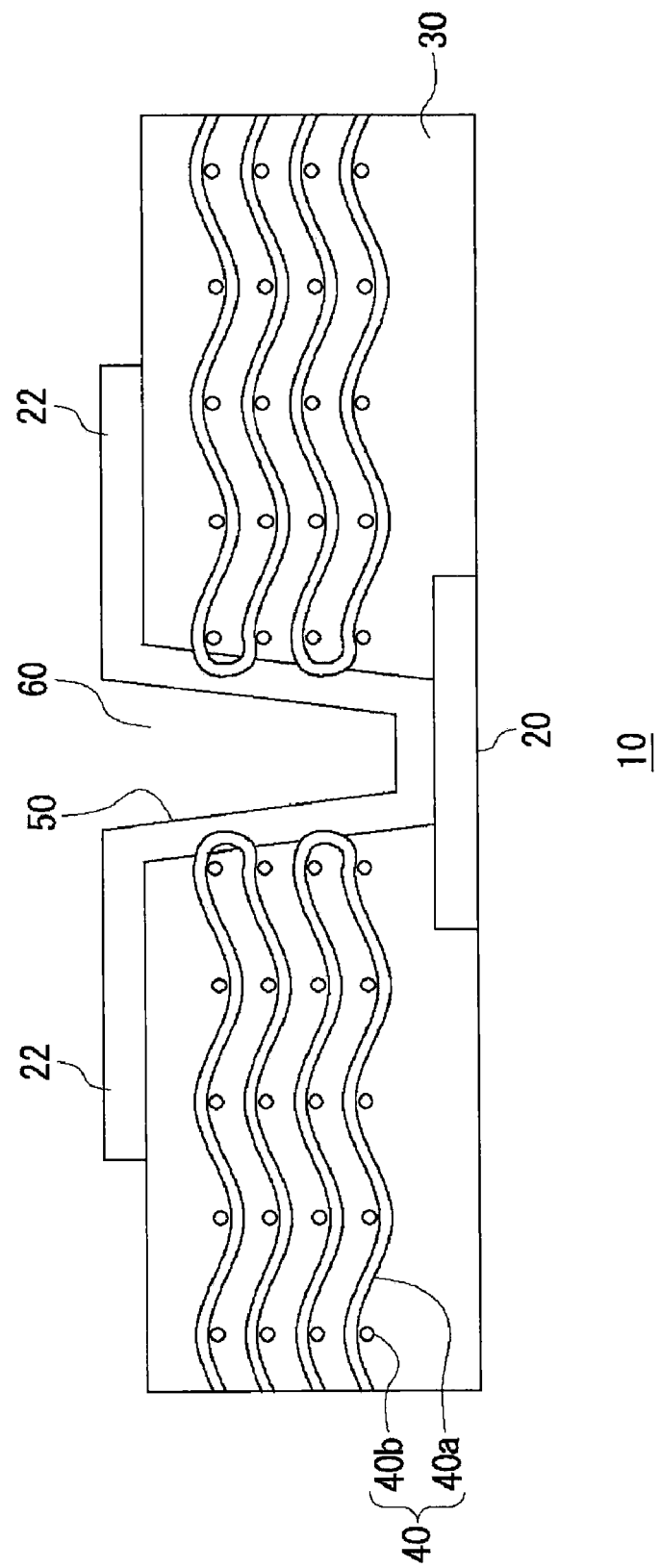
FIG. 1 is a sectional view showing a structure of a circuit board according to an embodiment of the present invention.

FIG. 1 is a sectional view showing a structure of a circuit board 10 according to an embodiment of the present invention. The circuit board 10 includes a first wiring layer 20, a second wiring layer 22, an insulating layer 30, glass fibers 40, and a via conductor 50.

The first wiring layer 20 and the second wiring layer 22, which constitute a part of multilayer wirings, have their respective wiring patterns. The material of the first wiring layer 20 and the second wiring layer 22 is not subject to any particular limitation, but a metal, such as copper, may be used suitably.

The insulating layer 30 is provided between the first wiring layer 20 and the second wiring layer 22. The first wiring layer 20 and the second wiring layer 22 are electrically insulated from each other by the insulating layer 30. The material that can be used for the insulating layer 30 may be, for instance, a thermosetting resin, such as a BT resin-type epoxy resin or a polyimide resin. The thickness of the insulating layer 30 is not subject to any particular limitation, but it is typically 35 μm to 120 μm.

Glass fibers (glass cloth) 40 made of fibrous glass, as core materials are embedded in the insulating layer 30. The glass fibers 40 embedded in the insulating layer 30 not only increase the strength of the insulating layer 30 but also improves the heat radiation and heat resistance thereof. The glass fibers 40 according to the present embodiment, is comprised of glass fibers 40a, which extend in a horizontal direction on sheet surface, and glass fibers 40b, which extend in a vertical direction on sheet surface, as shown in FIG. 1.

Figure 2:
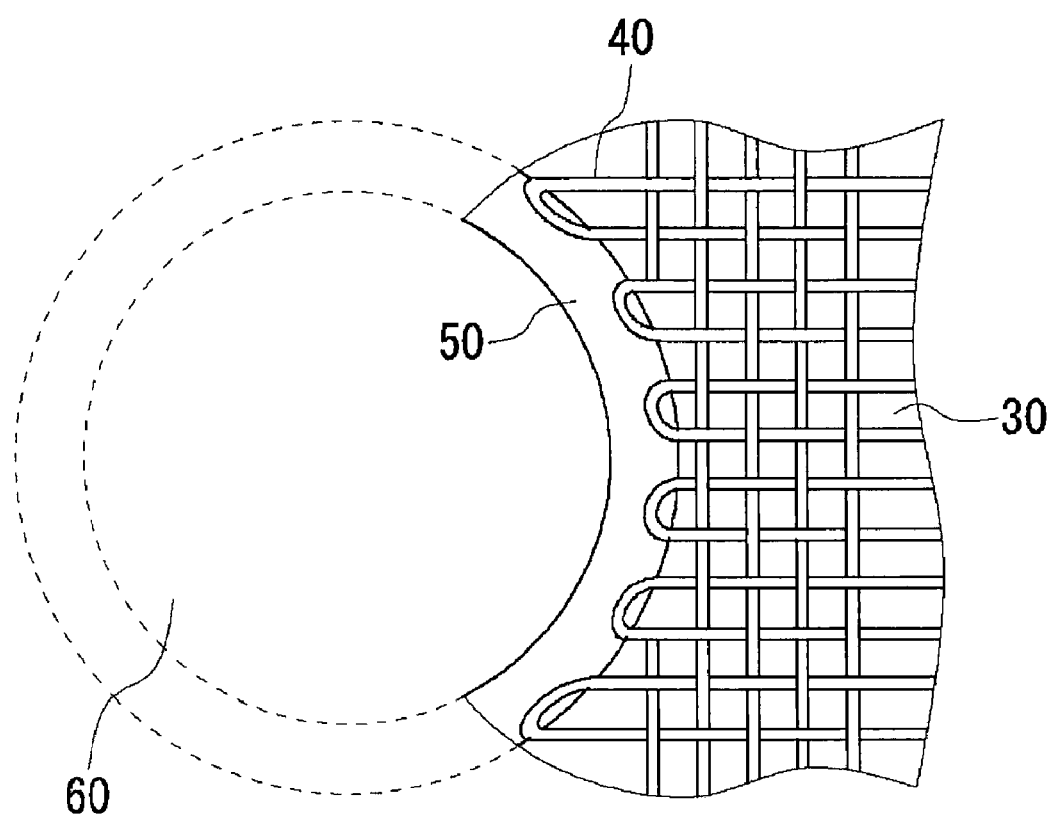
FIG. 2 illustrates joint forms of glass fibers in side walls of a via hole.

The via conductor 50 is provided in a via hole 60 which penetrates the insulating layer 30 at a predetermined position. In this embodiment, the via conductor 50 is formed in such a manner as to cover side walls of the via hole 60. And glass fibers 40 projecting from different positions on the side wall of the via hole 60 are joined with each other. Joints connecting glass fibers 40 with each other are embedded in the via conductor 50. The number of glass fibers 40 joined with each other is two at least. When two glass fibers are joined with each other, the joint takes a "U" shape as shown in FIG. 1. Note that, in FIG. 1, glass fibers 40 placed side by side in the depth direction of the via hole 60 are joined with each other. However, the joining direction is not limited thereto. For example, as shown in FIG. 2, glass fibers 40 placed side by side in the plane direction of the insulating layer 30 may be joined with each other.

The structure of a circuit board according to the present embodiment is such that the joining of a plurality of glass fibers projecting from the side wall of the via hole with each other can eliminate the abnormal growths of plating that are otherwise caused by the projections of glass fibers with cut sections or end faces from the side of the via hole. Also, since a plurality of glass fibers projecting from the side wall of the via hole are joined with each other, the surface area of the glass fibers in contact with the plating metal in the plated layer increases. For example, the thermal conductivities of quartz glass and soda glass used in the glass fiber are 1.38 W/mK and 1.03 W/mK, respectively. In contrast to this, the thermal conductivity of an epoxy resin used in the insulating layer is 0.3 W/mK. Thus, the glass fiber having a higher thermal conductivity than the insulating resin helps to improve the heat radiation of the via.

Further, since a plurality of glass fibers projecting from the side wall of the via hole are joined with each other, the joints connecting the glass fibers with each other are embedded completely within the plating. For instance, when two glass fibers are joined with each other, the U-shaped joint bites into the plating. As a result, even if there occurs some force to rip the copper plating up, the anchor effect produced by the joints of glass fibers will suppress such a force.

Method for Manufacturing Circuit Boards

Figure 3A:
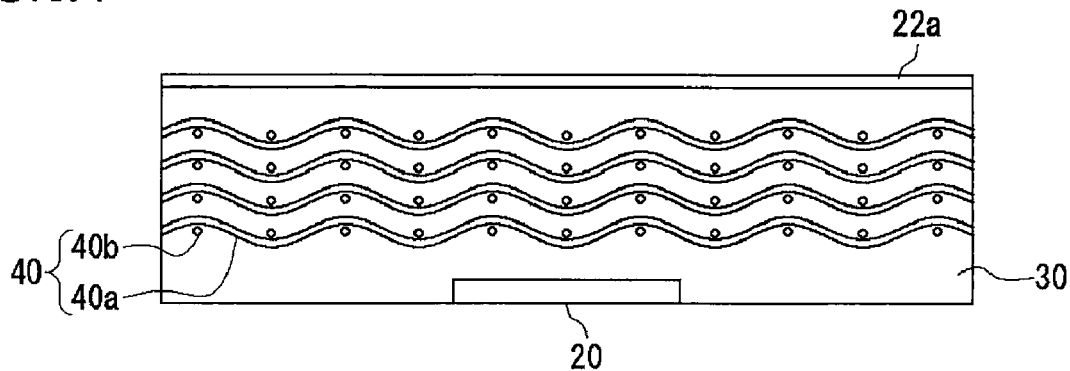
FIGS. 3A to 3C are sectional views illustrating processes of manufacturing a circuit board according to the present embodiment.
Figure 3B:
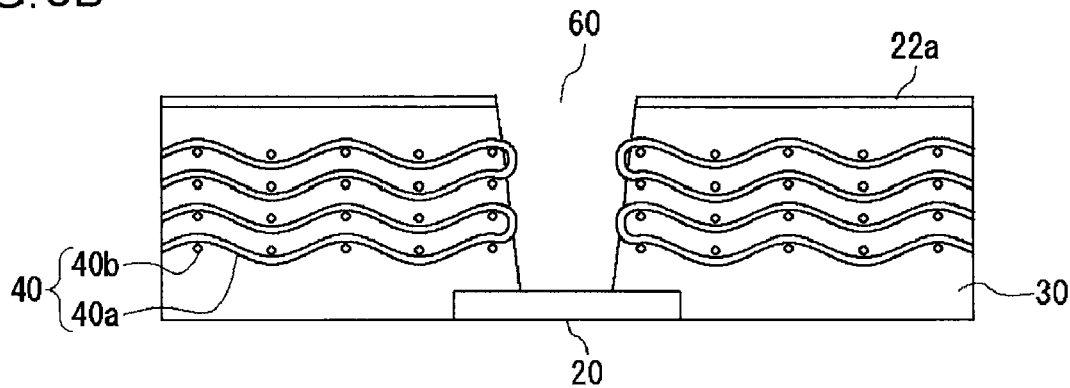
Figure 3C:
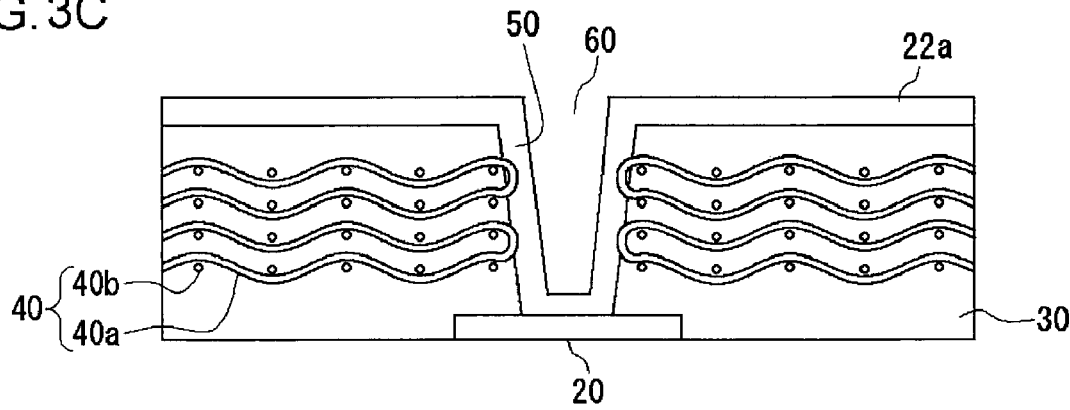

FIGS. 3A to 3C are sectional views illustrating processes of manufacturing a circuit board 10 according to the present embodiment. As shown in FIG. 3A, a layered product composed of a first wiring layer 20, a copper foil 22a, and an insulating layer 30 is formed. The first wiring layer 20 is obtained by forming a predetermined wiring pattern from a copper foil of 3 μm thickness, using a processing method combining photolithography and etching, for instance. A layered product as shown in FIG. 3A is obtained in a manner that a laminated sheet of the copper foil 22a glued to the insulating layer 30 having been filled with glass fibers 40 in advance is attached to the top of the first wiring layer 20.

Next, as shown in FIG. 3B, a via hole 60 is formed by performing a laser processing to a predetermined position in the copper foil 22a and the insulating layer 30. To be more precise, a via hole 60 was formed by concentrating a laser beam into a diameter of about 100 μm by the use of an RF excitation type slab $CO_2$ laser (wavelength: 10.6 μm, pulse width: 14 μsec: hereinafter referred to simply as a $CO_2$ laser) and a reduced projection type optical system using a metal mask and irradiating the beam to the predetermined position in the copper foil 22a and the insulating layer 30. The typical value of energy given by the $CO_2$ laser at the time of forming the via hole 60 is 5.8 mJ.

Then, a thin copper film of several hundred nm thick is deposited on the side wall surface of the via hole 60 by an electroless copper plating using palladium or the like as a catalyst. After this, a via conductor 50 is formed by an electrolytic copper plating using a copper sulfate solution as the plating liquid (see FIG. 3C). Through this electrolytic copper plating, copper piles up on the copper foil 22a until the thickness of the copper foil 22a reaches a predetermined value. Finally, a patterning using photolithography and etching is performed on the thickened copper foil 22a to form a second wiring layer 22 (see FIG. 1) with a predetermined wiring pattern.

Figure 4:
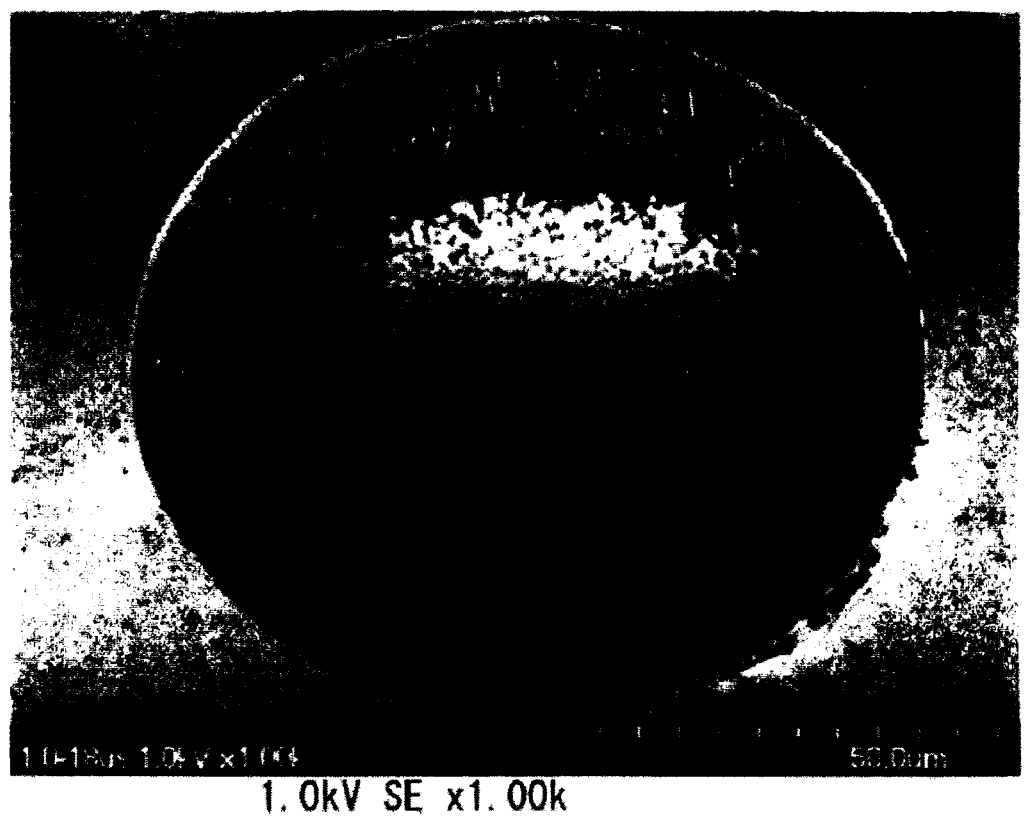
FIG. 4 is an SEM (Scanning Electron Microscope) photo image (magnification: 1000×) showing an overall structure of a via hole formed by $CO_2$ laser irradiation.
Figure 5:
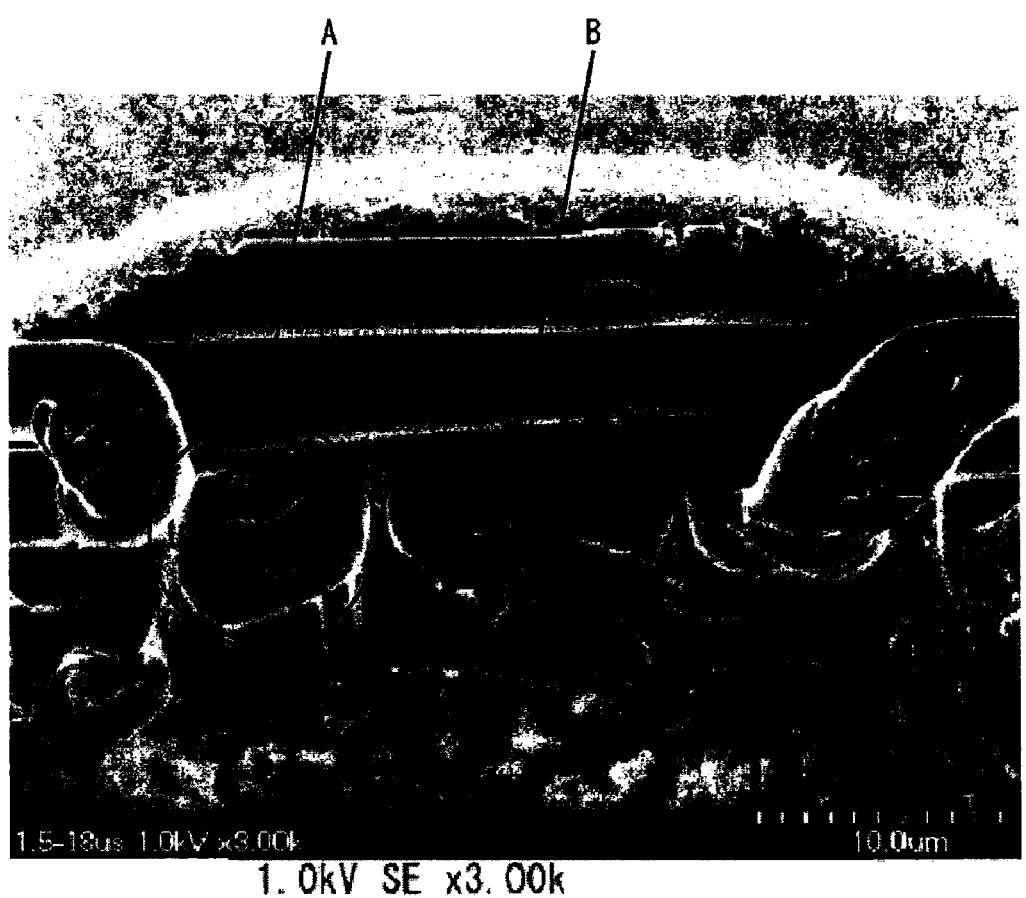
FIG. 5 is an SEM (Scanning Electron Microscope) photo image (magnification: 3000×) showing a side-wall structure of a via hole formed by $CO_2$ laser irradiation.

FIG. 4 and FIG. 5 are SEM (Scanning Electron Microscope) photo images of a via hole formed by $CO_2$ laser irradiation (pulse width: 15 µsec). In the portion indicated by arrow A in FIG. 5, it can be seen that two glass fibers 40 are projecting in the two different positions on the side wall of the via hole 60 and joined with each other in a "U" shape. And in the portion indicated by arrow B in FIG. 5, three glass fibers 40 are projecting in the three different positions on the side wall of the via hole 60 and joined with one another.

The mechanism by which the glass fibers 40 projecting from the side wall of a via hole are joined together by $CO_2$ laser irradiation is supposed to be as follows. A via hole 60 is formed as $CO_2$ laser irradiation raises the temperature of the insulating layer 30 and causes the insulating layer 30 to melt and eventually evaporate. The laser strength profile in the direction perpendicular to the irradiation direction of $CO_2$ laser beam assumes a Gaussian distribution. That is, the laser strength at the side wall of the via hole 60 is relatively lower than that at the center thereof. As a result, if the irradiation energy of the $CO_2$ laser is not sufficient (e.g., when the pulse width is 9 µsec), the insulating layer 30, which melts at a lower temperature than the glass fibers 40, will melt and evaporate first, thus leaving little processed glass fibers 40 projecting into the via hole.

On the other hand, if the pulse width of $CO_2$ laser is increased to 15 µsec, then the energy supplied by the $CO_2$ laser will increase proportionately to the increase in the pulse width. The energy inputted when the pulse width is 15 µsec is 1.67 times that when it is 9 µsec. It is speculated therefore that as a result of this excessive energy input, the rest of the energy spent for the melting and evaporation of the insulating layer 30 causes the glass fibers 40 to melt and the adjacent melting glass fibers 40 join together under surface tension.

It has been found that if the pulse width is further increased to raise the pulse energy even higher, then the result is damages, such as peeling and deformation of copper foil around the via hole while the joining of glass fibers 40 together is accomplished. Moreover, the increased regression of the insulating layer 30 causes an excessive exposure of the glass fibers 40, thus making it difficult to cover the glass fibers with copper plating. To be more precise, an experiment of via formation using the pulse width of $CO_2$ laser of 18 µsec or more resulted in damage in the lower wiring layer (corresponding to the first wiring layer 20 in FIG. 1) and the copper foil (the copper foil 22a in FIG. 3A), which made it difficult to manufacture a desired circuit board.

Note that UV laser is sometimes used in forming via holes of imprinted circuit boards, but the glass constituting the glass fibers absorbs little UV light. Hence, the UV laser cannot process the glass fibers and therefore it is almost impossible to produce the structure of the glass fibers joined with each other as shown in FIG. 1.

The present invention is not limited to the above-described embodiments only, and it is understood by those skilled in the art that various modifications such as changes in design may be made based on their knowledge and the embodiments added with such modifications are also within the scope of the present invention.

For example, in the above-described embodiments, the via conductor is formed along the side wall of a via hole, but the arrangement is not limited thereto. For instance, the via conductor may fill up the via hole. In such an arrangement, a stack via filling a via hole according to the embodiments of the present invention may enable a buildup of multilayer wirings.

Also, for the glass fibers 40 illustrated in FIG. 1, individual glass fibers are independently interwoven with one another, but the application covered herein is not limited thereto. For example, the glass fibers 40 may be formed by interweaving bundles of a plurality of glass fibers. In such a case, the joining of groups of glass fibers projecting into the via hole in different positions of the side wall thereof together may accomplish the same advantageous effect as when the individual glass fibers are joined together.

What is claimed:

1. A circuit board, comprising:
   a plurality of wiring layers;
   an insulating layer, including a plurality of core materials therein, which is made of resin that electrically insulates each of said plurality of wiring layers from another; and
   a via conductor, provided in a via hole penetrating said insulating layer at a predetermined position, which electrically interconnects said plurality of wiring layers,
   wherein in a side wall of the via hole, the plurality of core materials project inward from the side wall of the via hole and the plurality of core materials thus projecting are joined together in a U-shape in said via conductor.

2. A circuit board according to claim 1, wherein the plurality of core materials are glass fiber.

* * * * *